United States Patent [19]
Chang

[11] Patent Number: 6,049,480
[45] Date of Patent: Apr. 11, 2000

[54] CIRCUIT FOR PERFORMING AUTO-VERIFYING PROGRAM ON NON-VOLATILE MEMORY DEVICE

[75] Inventor: Seung-Ho Chang, Cheongju, Rep. of Korea

[73] Assignee: LG Semicon Co., Ltd., Cheongju, Rep. of Korea

[21] Appl. No.: 09/317,950

[22] Filed: May 25, 1999

[30] Foreign Application Priority Data

Mar. 4, 1999 [KR] Rep. of Korea .......................... 99-7147

[51] Int. Cl.[7] .................................................. G11C 16/06
[52] U.S. Cl. .............................. 365/185.22; 365/185.17; 365/185.21
[58] Field of Search .................... 365/185.17, 185.21, 365/185.22, 185.33

[56] References Cited

U.S. PATENT DOCUMENTS

| | | | |
|---|---|---|---|
| 5,495,442 | 2/1996 | Cernea et al. | 365/185.03 |
| 5,684,741 | 11/1997 | Talreja | 365/185.22 |
| 5,801,993 | 9/1998 | Choi | 365/185.33 |
| 5,892,714 | 4/1999 | Choi | 365/185.22 |

*Primary Examiner*—Trong Phan
*Attorney, Agent, or Firm*—Fleshner & Kim, LLP

[57] ABSTRACT

A circuit for performing an auto-verifying program on a non-volatile memory device which is capable of overcoming a disadvantage of a conventional circuit which it cannot limit a maximum value of a cell current, and thus applies stress to the circuit, which results in large current consumption, includes: a voltage clamping unit applying a clamp voltage to a selected memory cell; a first active load unit supplying a reference current to the selected memory cell; a second active load unit supplying an additional current and limiting a maximum value of the cell current, when the selected memory cell is programmed; and a logic circuit unit isolating each unit from the selected memory cell, when the programming is completed, whereby the circuit directly compares the currents when the auto-verifying program is carried out, does not require a process of computing a variation of the voltage for the cell current, and thus is more simplified, which results in improved memory chip constituting efficiency, and increased accuracy of the auto-verifying program, and the maximum current can be limited when the auto-verifying program is carried out, and thus less stress is applied to the other circuits, such as a high voltage supply unit in a memory chip, and current consumption thereof is reduced.

8 Claims, 4 Drawing Sheets

CIRCUIT FOR PERFORMING AUTO-VERIFYING PROGRAM ON NON-VOLATILE MEMORY DEVICE

BACKGROUND OF THE INVENTION

1. Field of the Invention

The present invention relates to a circuit for performing an auto-verifying program on a non-volatile memory cell of a semiconductor memory device, and in particular to a circuit for performing an auto-verifying program on a non-volatile memory cell which can be sensed with an auto-verifying program for comparing currents, and which can limit a maximum value of a cell current.

2. Description of the Background Art

As known methods of programming an EEPROM flash memory device among non-volatile memories, there have been employed a method of sequentially programming and verifying the memory, and an auto-verifying programming method or a simultaneous programming and verifying method which applies a long program pulse until the memory is completely programmed, and removes all program states once it is programmed.

In the auto-verifying programming method, whether a memory cell is programmed to a wanted extent is generally determined by observing a current variation of the memory cell.

FIG. 1 is a schematic circuit diagram illustrating a conventional auto-verifying programming device. Referring to FIG. 1, the auto-verifying programming device includes a load unit 1 connected to a selected cell FMC and serving as a load, a voltage clamping unit 2 applying a clamp voltage VCLAMP to a drain of the selected cell FMC, and a comparison unit 3 comparing a voltage of a first node ND1 with a reference voltage VREF, and outputting a program enable signal PROEN.

The load unit 1 includes a PMOS diode formed by a PMOS transistor PMD having its source connected to receive the programming voltage VPP, and its gate and drain commonly-connected, that is, being diode-connected to the drain of the selected cell FMC.

The voltage clamping unit 2 includes: a first PMOS transistor PM1 and a second PMOS transistor PM2 in parallel and having their respective sources connected to receive the programming voltage VPP, and their gates commonly connected, the gate and drain of the second PMOS transistor PM2 being commonly connected; a first NMOS transistor NM1 having its gate connected to the drain of the selected cell FMC and its drain connected to the drain of the first PMOS transistor PM1; a second NMOS transistor NM2 having its gate connected to receive the clamp voltage VCLAMP, and its drain connected to the drain of the second PMOS transistor PM2; a third NMOS transistor NM3 having its gate connected to receive a clamping control signal CLAMPEN, its drain connected to the commonly-connected sources of the first and second NMOS transistors NM1, NM2, and its source connected to a ground voltage VSS; and a fourth NMOS transistor NM4 having its gate connected to the commonly-connected drains of the first PMOS transistor PM1 and the first NMOS transistor NM1, its drain connected to the first node ND1, and its source connected to the drain of the selected cell FMC.

The comparison unit 3 is a differential amplifier having its first input terminal connected to receive a voltage of the first node ND1, and its second input terminal connected to receive the reference voltage VREF.

The operation of the thusly-constituted circuit for performing the auto-verifying program on the EEPROM flash memory will now be described.

First, when the selected cell FMC is programmed, as shown in FIG. 2, a voltage variation of the first node ND1 which is varied at a high potential according to a load generated by the diode-connected PMOS transistor PMD is compared with the reference voltage VREF by the differential amplifier composing the comparison unit 3.

Here, at a point that the voltage of the first node ND1 becomes higher than the reference voltage VREF, namely at a point (A) indicated in FIG. 2, the comparison unit 3 outputs the program enable signal PROEN. The program enable signal PROEN is outputted as the clamping control signal CLAMPEN by a logic circuit (not shown), and applied to the gate of the third NMOS transistor NM3 in the voltage clamping unit 2.

Thereupon, the voltage clamping unit 2 ceases to apply the clamp voltage VCLAMP to the selected cell FMC.

This operation implies that the programming of the selected cell FMC is completed.

The general circuit for performing the auto-verifying programming on the memory cell compares the currents of the memory cell by employing a voltage comparator, and employs a mapping for the current and voltage. It is thus difficult to directly compare the currents.

In addition, the amount of current flowing while the memory cell is programmed is a factor determining the number of the memory cells which are programmable at a time. As the current increases, it imposes a burden on the other circuits in the memory chip, such as a high voltage supply unit and a sense amplifier.

FIG. 3 is a circuit diagram illustrating a conventional circuit for performing an auto-verifying program on an EEPROM flash memory. Referring to FIG. 3, the circuit includes: a first current supply unit 10 supplying a reference current IREF to the selected cell FMC; a second current supply unit 20 supplying an additional current IADD to the selected cell, and a logic circuit unit 30 isolating the first current supply unit 10 and the second current supply unit 20 from the selected cell FMC when the program is completed.

The first current supply unit 10 includes: a first PMOS transistor PM11 and a second PMOS transistor PM12 having their respective sources connected to receive the programming voltage VPP, and their gates commonly connected, the drain of the first PMOS transistor PM11 being connected to the drain of the selected cell FMC, the gate and drain of the second PMOS transistor PM12 being commonly connected; a first NMOS transistor NM11 having its drain connected to the drain of the second PMOS transistor PM12, its gate and drain commonly connected, and its source connected to the ground voltage VSS.

The second current supply unit 20 includes an NMOS transistor NM21 having its drain connected to receive the programming voltage VPP, its source connected to the drain of the selected cell FMC, and its gate connected to receive the clamping control signal CLAMPEN from the logic circuit unit 30.

The logic circuit unit 30 is connected in series between the programming voltage VPP and the ground voltage VSS, and includes: a PMOS transistor PM31 having its gate connected to the drain of the selected cell FMC, and an NMOS transistor NM31 having its gate connected to the gate of the NMOS transistor NM11 in the first current supply unit 10. The commonly-connected drains of the PMOS transistor PM31 and the NMOS transistor NM31 are connected to the gate of the NMOS transistor NM21 of the second current supply unit 20.

The operation of the thusly-constituted circuit for performing the auto-verifying program on the EEPROM flash memory will now be explained.

The first current supply unit 10 supplies the reference current IREF to the selected cell FMC, and the second current supply unit 20 supplies the additional current IADD to the selected cell FMC, thereby proceeding with the auto-verifying program.

Referring to FIG. 4, at a point (B) that the cell current ICELL becomes identical to the reference current IREF, the voltage at the drain of the selected cell FMC becomes a low potential, and is sharply changed to a high potential. Accordingly, the NMOS transistor NM21 of the second current supply unit 20 is turned off the by CLAMPEN signal from the logic circuit unit 30, thereby completing the program.

As described above, the conventional circuit for performing the auto-verifying program on the EEPROM flash memory serves to detect a programming point by comparing the point where the reference current IREF becomes identical to the cell current ICELL, without requiring a special comparator.

However, the conventional circuit for performing the auto-verifying program on the EEPROM flash memory has a disadvantage in that it cannot limit a maximum value of the cell current, and thus applies stress to the circuit, which results in large current consumption.

SUMMARY OF THE INVENTION

It is therefore an object of the present invention to provide a circuit for performing an auto-verifying program on a non-volatile memory device which is stabilized by limiting a maximum value of a cell current and by reducing stress applied to the circuit, and which can reduce current consumption.

In order to achieve the above-described object of the present invention, there is provided a circuit for performing an auto-verifying program on a volatile memory, including: a voltage clamping unit applying a clamp voltage to a selected memory cell; a first active load unit supplying a reference current to the selected memory cell; a second active load unit supplying an additional current and limiting a maximum value of a cell current, when the selected memory cell is programmed; and a logic circuit unit isolating each unit from the selected cell when the program is completed.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
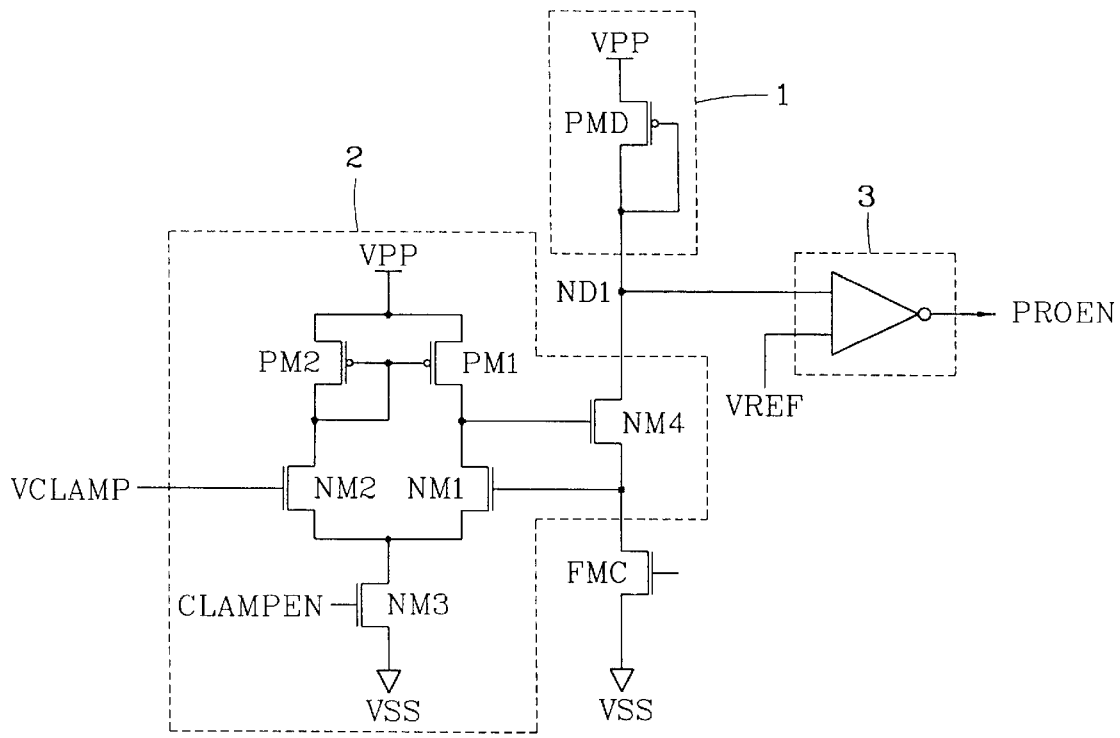
FIG. 1 is a schematic circuit diagram illustrating a general circuit for performing an auto-verifying program.
Figure 2:
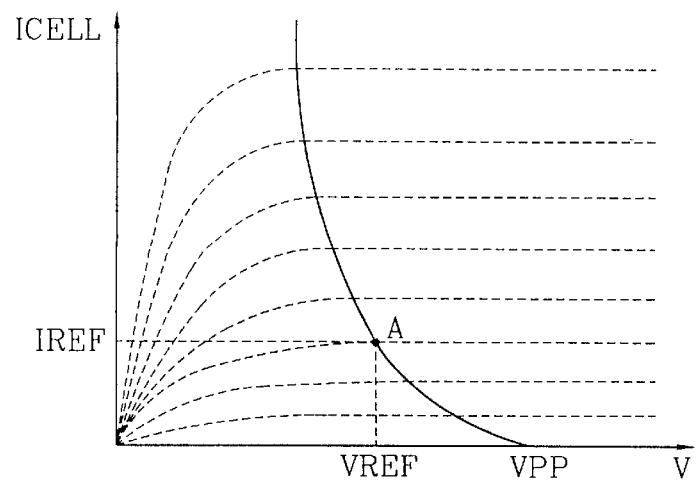
FIG. 2 is a graph showing property curves of a cell current and a programming voltage when the program is carried out in the configuration of FIG. 1 1.
Figure 3:
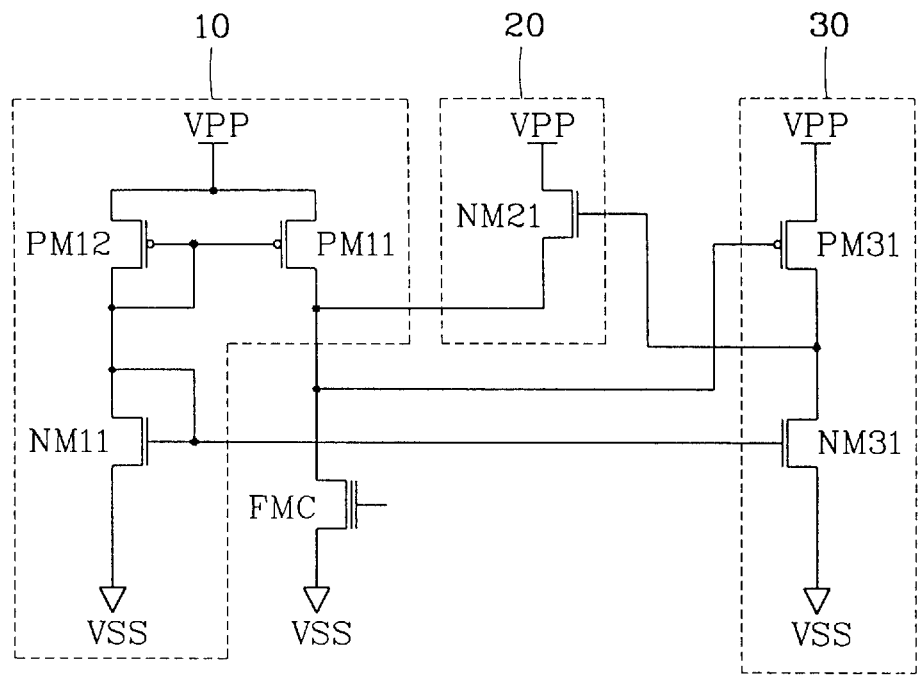
FIG. 3 is a circuit diagram illustrating a conventional circuit for performing an auto-verifying program.
Figure 4:
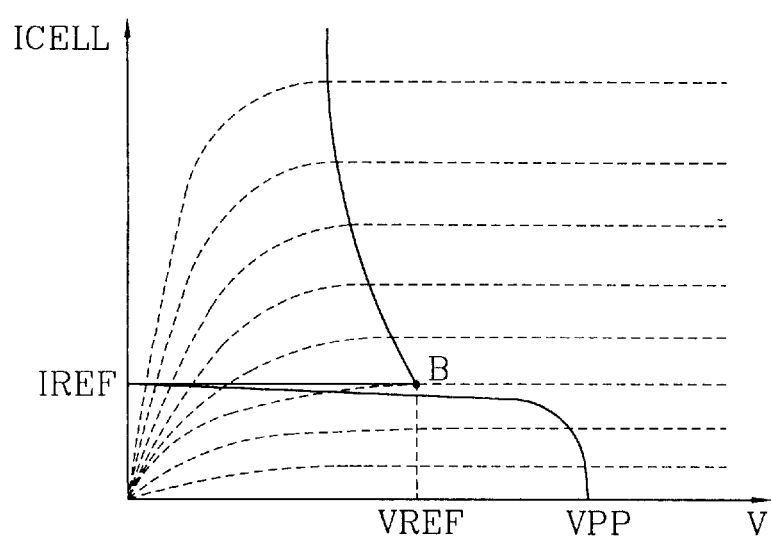
FIG. 4 is a graph of cell current and programming voltage when the program is carried out in the configuration of FIG. 3.
Figure 5:
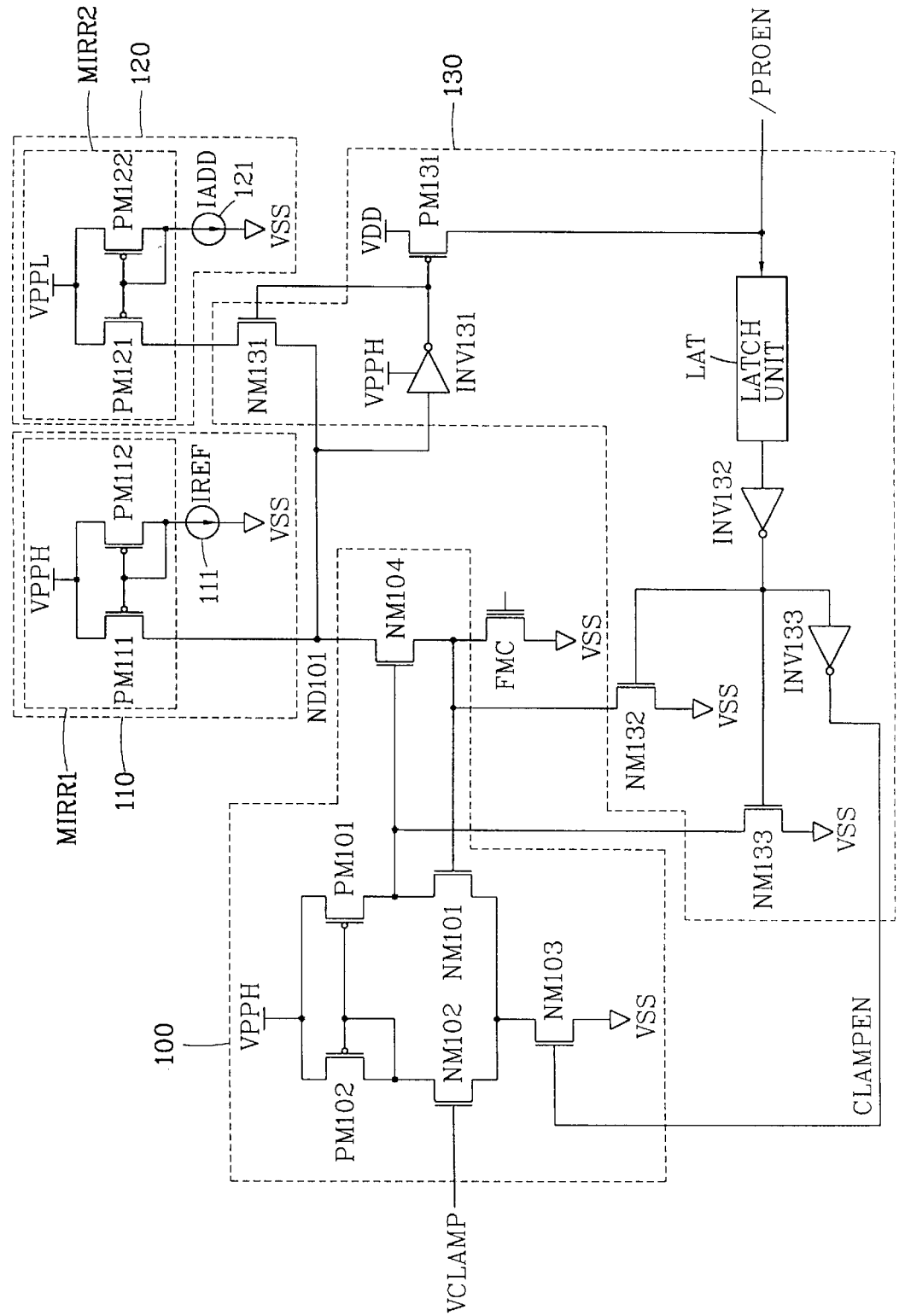
FIG. 5 is a schematic circuit diagram illustrating a circuit for performing an auto-verifying program according to the present invention.

FIG. 5 is a schematic circuit diagram illustrating a circuit for performing an auto-verifying program on a non-volatile memory device in accordance with the present invention. Here, an EEPROM flash memory is employed for explanation purposes. Referring to FIG. 5, the circuit for performing the auto-verifying program on the non-volatile memory includes: a voltage clamping unit 100 supplying a clamp voltage VCLAMP to a selected cell FMC; a first active load unit 110 supplying a reference current IREF which corresponds to a threshold voltage of the cell to be programmed; a second active load unit 120 supplying an additional current IADD when the selected cell FMC is being programmed; and a logic circuit unit 130 isolating each unit from the selected cell FMC when the program is completed.

Here, the voltage clamping unit 100 includes: a first PMOS transistor PM101 and a second PMOS transistor PM102 having their respective sources connected to receive a high programming voltage VPPH and having their gates commonly connected, the gate and drain of the second PMOS transistor PM102 being commonly connected; a first NMOS transistor NM101 having its gate connected to the drain of the selected cell FMC and its drain connected to the drain of the first PMOS transistor PM101; a second NMOS transistor NM102 having its gate connected to receive a clamp voltage VCLAMP and its drain connected to the drain of the second PMOS transistor PM102; a third NMOS transistor NM103 having its gate connected to receive a clamping control signal CLAMPEN from the circuit unit 130, having its drain connected to the commonly-connected sources of the first and second NMOS transistors NM101, NM102, and having its source connected to the ground voltage VSS; and a fourth NMOS transistor NM104 having its gate connected to the commonly-connected drains of the first PMOS transistor PM101 and the first NMOS transistor NM101, having its drain connected to a first node ND101, and having its source connected to the drain of the selected cell FMC.

The first active load unit 110 includes: a first current mirror MIRR1 consisting of first PMOS transistor PM111 and a second PMOS transistor PM112 having their respective sources connected to receive the high programming voltage VPPH and having their gates commonly connected, the gate and drain of the second PMOS transistor PM112 being commonly connected; and a first current supply source 111 connected between the drain of the second PMOS transistor PM112 in the first current mirror MIRR1 and the ground voltage VSS, and supplying the reference current IREF to the selected cell FMC.

The second active load unit 120 includes: a second current mirror MIRR2 consisting of a first PMOS transistor PM121 and a second PMOS transistor PM122 having their respective sources connected to receive a low programming voltage VPPL, and having their respective gates commonly connected, the gate and drain of the second PMOS transistor PM122 being commonly connected; and a second current supply source 121 connected between the drain of the second PMOS transistor PM122 in the second current mirror MIRR2 and the ground voltage VSS.

The logic circuit unit 130 includes: a first inverter INV131 driven by the high programming voltage VPPH, and inverting a voltage of the first node ND101; a first NMOS transistor NM131 having its channel connected in series between the second active load unit 120 and the first node ND101, and controlled by an output signal from the first inverter INV131 applied to its gate; a first PMOS transistor PM131 having its source connected to receive a power supply voltage VDD, and its gate connected to receive the output signal from the first inverter INV131; a latch unit LAT having its input terminal connected to the drain of the first PMOS transistor PM131, and latching a program enable signal/PROEN; a second inverter INV132 inverting an output signal from the latch unit LAT; a second NMOS transistor NM132 having its gate connected to receive an output signal from the second inverter INV132, its drain connected to the gate of the first NMOS transistor NM101 in the voltage clamping unit 100 and to the drain of the selected cell FMC, and its source connected to the ground voltage VSS; a third NMOS transistor NM133 having its gate connected to receive the output signal from the second inverter INV132, its drain connected to the gate of the fourth NMOS transistor NM104 in the voltage clamping unit 100, and its source connected to the ground voltage VSS; and a third inverter INV133 inverting the output signal from the second inverter INV132, and outputting the clamping control signal CLAMPEN.

The operation of the thusly-constituted circuit for performing the auto-verifying program on the EEPROM flash memory in accordance with the present invention will now be described with reference to the accompanying drawings.

In order to program the selected cell FMC, the first active load unit 110 supplies the reference current IREF to the selected cell FMC. The second active load unit 120 provides the additional current IADD.

Figure 6:
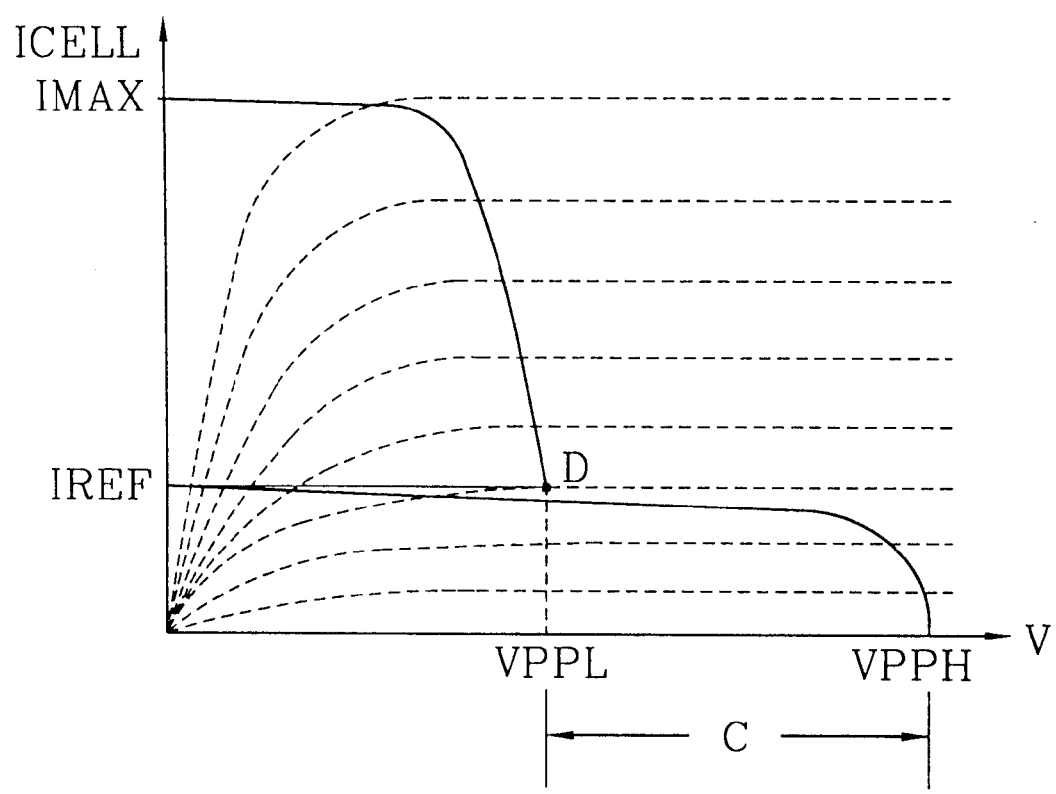
FIG. 6 is a graph of cell current and programming voltage when a program is carried out in the configuration of FIG. 5

Here, the additional current IADD has a maximum value IMAX. As illustrated in FIG. 6, the cell current ICELL flowing in the selected cell FMC is not more than the maximum current IMAX that is the maximum value of the values obtained by adding the reference current IREF supplied from the first active load unit 100 and the additional current IADD supplied by the second active load unit 120, thereby limiting the cell current ICELL.

In addition, as shown in FIG. 6, a special region (C) is necessary to detect a point where the selected cell FMC is programmed, namely a point where the cell current ICELL becomes smaller than the reference current IREF. Here, the supply voltage VPPL applied to the second active load unit 120 is set lower than the supply voltage VPPH applied to the first active load unit 110. Accordingly, the difference between the supply voltage VPPL applied to the first active load unit 110 becomes the region (C).

Here, as the region (C) becomes wider, the cell current sharply swings to the low potential at the point (D) in which the selected cell FMC is programmed. As a result, sensing is improved at the point (D).

In addition, when the programming is carried out, the first NMOS transistor NM131 in the logic circuit unit 130 is turned off by the output signal from the first inverter INV131, and thus isolates the second active load unit 120 from the selected cell FMC. Accordingly, it is possible to obtain the region (C) as large as possible.

That is, the cell current ICELL is driven and programmed by the current supplied by the first and second active load units 110, 120. At an initial stage of programming, the cell current ICELL is limited by the second active load unit 120 to nor more than the maximum current IMAX.

Referring to FIG. 6, when the cell current ICELL becomes equal to or less than the reference current IREF, the graph of cell current sharply moves to the low potential. Here, the logic circuit unit 130 isolates the second active load unit 120 from the selected cell FMC, and simultaneously isolates the voltage clamping unit 130 therefrom, thereby stopping the program. Accordingly, the auto-verifying program is carried out.

As discussed earlier, the circuit for performing the auto-verifying program on the non-volatile memory device according to the present invention directly compares the currents when the auto-verifying program is carried out, and thus does not require a process of computing a variation of the voltage for the cell current. As a result, the circuit is more simplified, which results in improved memory chip constituting efficiency, and increased accuracy of the auto-verifying program. When the circuit performs the auto-verifying program, the maximum current can be limited. Accordingly, less stress is applied to the other circuits such as the high voltage supply unit in the memory chip, and current consumption is reduced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A circuit for performing an auto-verifying program on a non-volatile memory device, comprising:

a voltage clamping unit for supplying a clamp voltage to a selected memory cell of a non-volatile memory device;

a first active load unit for supplying a reference current to the selected memory cell;

a second active load unit for supplying an additional current, and for limiting a maximum value of a cell current, when the selected memory cell is programmed; and a logic circuit unit for isolating each unit from the selected memory cell when the program is completed.

2. The circuit according to claim 1, wherein the voltage clamping unit comprises:

a first PMOS transistor and a second PMOS transistor having their respective sources connected to receive a high programming voltage, and having their respective gates commonly connected, the gate and drain of the second PMOS transistor being commonly connected;

a first NMOS transistor having its gate connected to a drain of the selected memory cell, and having its drain connected to the drain of the first PMOS transistor;

a second NMOS transistor having its gate connected to receive a clamp voltage, and having its drain connected to the drain of the second PMOS transistor;

a third NMOS transistor having its gate connected to receive a clamping control signal, having its drain connected to the commonly-connected sources of the first and second NMOS transistors, and its having source connected to a ground voltage; and a fourth NMOS transistor having its gate connected to the commonly-connected drains of the first PMOS transistor and the first NMOS transistor, having its drain connected to a first node, and having its source connected to the drain of the selected cell.

3. The circuit according to claim 1, wherein the first active load unit comprises:
   a reference current supply source for generating the reference current; and
   a current mirror driven by the high programming voltage, and supplying the reference current to the selected cell.

4. The circuit according to claim 3, wherein the current mirror comprises
   a first PMOS transistor and a second PMOS transistor having their respective sources connected to receive the high programming voltage, and having their respective gates commonly connected to the reference current supply source, the gate and drain of the second PMOS transistor being commonly connected.

5. The circuit according to claim 1, wherein the second active load unit comprises:
   a reference current supply source for generating the additional current; and
   a current mirror driven by the low programming voltage, and supplying the additional current to the selected cell.

6. The circuit according to claim 5, wherein the current mirror comprises a first PMOS transistor and a second PMOS transistor having their respective sources connected to receive the low programming voltage, and having their respective gates commonly connected to the reference current supply source, the gate and drain of the second PMOS transistor being commonly connected.

7. The circuit according to claim 1, wherein the logic circuit unit comprises:
   a first inverter driven by the high programming voltage, and inverting a voltage from the drain of the selected memory cell;
   a first NMOS transistor controlled by an output signal from the first inverter, and isolating the second active load unit from the selected memory cell;
   a first PMOS transistor having its source connected to receive a power supply voltage, and having its gate connected to receive the output signal from the first inverter;
   a latch unit having an input terminal connected to the drain of the first PMOS transistor, and latching an externally applied program enable signal;
   a second inverter for inverting an output signal of the latch unit;
   a second NMOS transistor having its gate connected to receive an output signal from the second inverter, having its drain connected to the gate of a first NMOS transistor in the voltage clamping unit and to the drain of the selected memory cell, and having its source connected to a ground voltage;
   a third NMOS transistor having its gate connected to receive the output signal from the second inverter, having its drain connected to the gate of a second NMOS transistor in the voltage clamping unit, and having its source connected to the ground voltage; and
   a third inverter for inverting the output signal from the second inverter and outputting a clamping control signal.

8. The circuit according to claim 1, wherein a maximum value of the memory cell current is the sum of the reference current supplied by the first active load unit and the additional current supplied by the second active load unit.

* * * * *